United States Patent
Wang et al.

(10) Patent No.: US 9,502,577 B2
(45) Date of Patent: Nov. 22, 2016

(54) OXIDE THIN FILM TRANSISTOR, DISPLAY DEVICE, AND METHOD FOR MANUFACTURING ARRAY SUBSTRATE

(71) Applicant: BOE TECHNOLOGY GROUP CO., LTD., Beijing (CN)

(72) Inventors: Ke Wang, Beijing (CN); Seongyeol Yoo, Beijing (CN); Ce Ning, Beijing (CN); Wei Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/416,227

(22) PCT Filed: Apr. 16, 2014

(86) PCT No.: PCT/CN2014/075507
§ 371 (c)(1),
(2) Date: Jan. 21, 2015

(87) PCT Pub. No.: WO2015/096307
PCT Pub. Date: Jul. 2, 2015

(65) Prior Publication Data
US 2016/0005869 A1   Jan. 7, 2016

(30) Foreign Application Priority Data

Dec. 25, 2013   (CN) .......................... 2013 1 0727116

(51) Int. Cl.
*H01L 29/786*   (2006.01)
*H01L 21/4763*   (2006.01)
(Continued)

(52) U.S. Cl.
CPC ..... *H01L 29/7869* (2013.01); *H01L 21/47635* (2013.01); *H01L 29/41733* (2013.01);
(Continued)

(58) Field of Classification Search
CPC .................. H01L 29/7869; H01L 29/42384; H01L 29/4908; H01L 29/513; H01L 29/518; H01L 29/66969; H01L 29/78606; H01L 21/47635

See application file for complete search history.

(56) References Cited

U.S. PATENT DOCUMENTS

| | | |
|---|---|---|
| 2003/0194839 A1 | 10/2003 | Chung |
| 2010/0117074 A1 | 5/2010 | Yamazaki et al. |

(Continued)

FOREIGN PATENT DOCUMENTS

| | | |
|---|---|---|
| CN | 1409417 A | 4/2003 |
| CN | 101320737 A | 12/2008 |

(Continued)

OTHER PUBLICATIONS

First Office Action regarding Chinese application No. 201310727116.0, dated Dec. 1, 2015. Translation provided by Dragon Intellectual Property Law Firm.

(Continued)

*Primary Examiner* — Whitney T Moore
(74) *Attorney, Agent, or Firm* — Harness, Dickey & Pierce, P.L.C.

(57) ABSTRACT

Provided are oxide thin-film transistor and display device employing the same, and method for manufacturing an oxide thin-film transistor array substrate. A source electrode and a drain electrode are located below an oxide active layer pattern, and a gate electrode is located below the source electrode and the drain electrode, and the gate insulating layer is located between the gate electrode and the source electrode/the drain electrode.

5 Claims, 2 Drawing Sheets

(51) Int. Cl.
*H01L 29/51* (2006.01)
*H01L 29/49* (2006.01)
*H01L 29/66* (2006.01)
*H01L 29/423* (2006.01)
*H01L 29/417* (2006.01)

(52) U.S. Cl.
CPC ..... *H01L29/42384* (2013.01); *H01L 29/4908* (2013.01); *H01L 29/513* (2013.01); *H01L 29/518* (2013.01); *H01L 29/66969* (2013.01); *H01L 29/78606* (2013.01)

(56) References Cited

U.S. PATENT DOCUMENTS

| | | | | |
|---|---|---|---|---|
| 2010/0258806 | A1* | 10/2010 | Nakayama | H01L 29/7869 257/59 |
| 2011/0127518 | A1* | 6/2011 | Jung | H01L 29/78606 257/43 |
| 2012/0138937 | A1* | 6/2012 | Jo | H01L 27/1218 257/59 |
| 2013/0146880 | A1 | 6/2013 | Liu | |
| 2013/0153028 | A1* | 6/2013 | Hayashi | H01L 29/66765 136/258 |
| 2013/0299817 | A1 | 11/2013 | Park et al. | |
| 2015/0200208 | A1* | 7/2015 | Lee | H01L 27/124 257/43 |

FOREIGN PATENT DOCUMENTS

| | | |
|---|---|---|
| CN | 101740633 A | 6/2010 |
| CN | 201853033 U | 6/2011 |
| CN | 102683424 A | 9/2012 |
| CN | 103715266 A | 4/2014 |
| WO | WO-2005-104239 A1 | 11/2005 |

OTHER PUBLICATIONS

Written Opinion of the International Searching Authority for international application No. PCT/CN2014/075507.

Second Office Action regarding Chinese application No. 201310727116.0, dated Jun. 2, 2016. Translation provided by Dragon Intellectual Property Law Firm.

* cited by examiner

OXIDE THIN FILM TRANSISTOR, DISPLAY DEVICE, AND METHOD FOR MANUFACTURING ARRAY SUBSTRATE

CROSS-REFERENCE TO RELATED APPLICATION

This application is the U.S. national phase of PCT Application No. PCT/CN2014/075507 filed on Apr. 16, 2014, which claims priority to Chinese Patent Application No. 201310727116.0 filed on Dec. 25, 2013, the disclosures of which are incorporated in their entirety by reference herein.

TECHNICAL FIELD

The present disclosure relates to the field of display technology, and in particular, to an oxide thin film transistor, a display device and a method for manufacturing an array substrate.

BACKGROUND

At present, in a thin film transistor (TFT) of a liquid crystal display, silicon, for example, amorphous silicon or polysilicon, usually acts as a main component of an active layer. For a TFT using the amorphous silicon as an active layer (hereinafter, referred to as an amorphous silicon TFT), as limited by features of the amorphous silicon such as mobility and on-state current, etc., it is difficult to be used in situations requiring a larger current and a faster response, for example, an organic light emitting display and a display with a large size, a high resolution and a high-refresh frequency, and the like. On the other hand, for a TFT using the polysilicon as the active layer (hereinafter, referred to as a polysilicon TFT), although it may be used in situations requiring the large current and the faster response as features of polysilicon is superior to that of the amorphous silicon, it is difficult to be used for manufacturing a panel with a medium or large size due to a poor homogeneity of the polysilicon. Therefore, a TFT using an oxide semiconductor as the active layer (hereinafter, referred to as an oxide TFT) gains more and more attention.

For the oxide TFT using the oxide semiconductor, for example, indium gallium zinc oxide (IGZO) and indium tin zinc oxide (ITZO), as the active layer, the mobility, on-state current, switching characteristic and the like are superior to that of the amorphous silicon TFT. Additionally, although the features of the oxide TFT are not as good as that of the polysilicon TFT, the oxide TFT is still good enough for applications requiring the larger current and the faster response. Moreover, as the oxide semiconductor has a good homogeneity, thus it has no problem relating to the homogeneity comparing with the polysilicon, then the active layer may be manufactured via sputtering, deposition, and the like, accordingly there is no need to add an additional device and the cost is low.

FIG. 1 is a structural representation of an oxide TFT array substrate in the prior art. As shown in FIG. 1, the oxide TFT array substrate includes an oxide TFT 1 and a pixel electrode 7, in which the oxide TFT 1 includes a gate electrode 2, a source electrode 3, a drain electrode 4 and an oxide active layer pattern 5, in which the source electrode 3 and the drain electrode 4 are located above the oxide active layer pattern 5, and the drain electrode 4 is connected with the pixel electrode 7. During a process for manufacturing an oxide TFT array substrate, the source electrode 3 and the drain electrode 4 are usually formed by etching a source/drain metal layer (not shown in drawings) using a wet process. As an etching solution may also etch the oxide active layer pattern 5 located below the source/drain metal layer, the oxide active layer pattern 5 will be destroyed thereby. In order to solve the above problem, in the prior art, an etch stopping layer 20 is manufactured on the oxide active layer pattern 5 except for regions where the oxide active layer pattern 5 is arranged in such a manner so as to be in contact with the source electrode 3 and the drain electrode 4, so that the oxide active layer pattern 5 is protected from being destroyed. However, this requires adding at least one photoetching process, which makes the current process for manufacturing an oxide TFT array substrate basically require 6 to 7 photoetching processes. As a result, the production cost will be increased.

SUMMARY

The present disclosure provides an oxide thin film transistor and a method for manufacturing an oxide thin film transistor array substrate, which may solve a problem of increased production cost caused by additional required photoetching process when an etch stopping layer is formed between a source electrode/a drain electrode and an oxide active layer pattern to protect the oxide active layer pattern from being destroyed in the prior art.

At the same time, the present disclosure further provides a display device, which uses the above oxide thin film transistor, which may reduce the production cost.

In order to solve the above technical problem, in an embodiment of the present disclosure, there provides an oxide thin film transistor, including a gate electrode, a gate insulating layer, an oxide active layer pattern, a source electrode and a drain electrode, wherein the source electrode and the drain electrode are located below the oxide active layer pattern; the gate electrode is located below the source electrode and the drain electrode; and the gate insulating layer is located between the gate electrode and the source electrode/the drain electrode.

At the same time, in another embodiment of the present disclosure, there provides an oxide thin film transistor display device, which includes the above oxide thin film transistor.

In a yet another embodiment of the present disclosure, there provides a method for manufacturing an oxide thin film transistor array substrate, which includes a step of forming an oxide thin film transistor on a base substrate, wherein the oxide thin-film transistor includes a gate electrode, a gate insulating layer, an oxide active layer pattern, a source electrode and a drain electrode, wherein the step of forming the oxide thin film transistor on the base substrate includes:

forming the gate electrode on the base substrate;

forming the gate insulating layer on the base substrate formed with the gate electrode;

forming the source electrode and the drain electrode on the base substrate formed with the gate insulating layer; and forming the oxide active layer pattern on the base substrate formed with the source electrode and the drain electrode.

The above technical solutions of the present disclosure have the following beneficial effects:

In the above technical solutions, by forming the source electrode, the drain electrode and the gate electrode below the oxide active layer pattern, in which the gate electrode is located below the source electrode and the drain electrode, an etching process for forming the source electrode and the drain electrode does not destroy the oxide active layer pattern. At the same time, as there is no need to form an etch stopping layer on the oxide active layer pattern, a photoetching process for forming a pattern of the etch stopping layer may be left out, thus the productivity of oxide thin-film transistor display devices may be improved, and the production cost may be reduced.

BRIEF DESCRIPTION OF THE DRAWINGS

In order to more clearly illustrate the technical solutions according to the embodiments of the present disclosure or the prior art, drawings required for describing embodiments of the present disclosure or the prior art are briefly introduced below. Apparently, the drawings in the description below are only some embodiments of the present disclosure, and other drawings may also be obtained by those skilled in the art according to these drawings without creative works.

DETAILED DESCRIPTION

Figure 1:
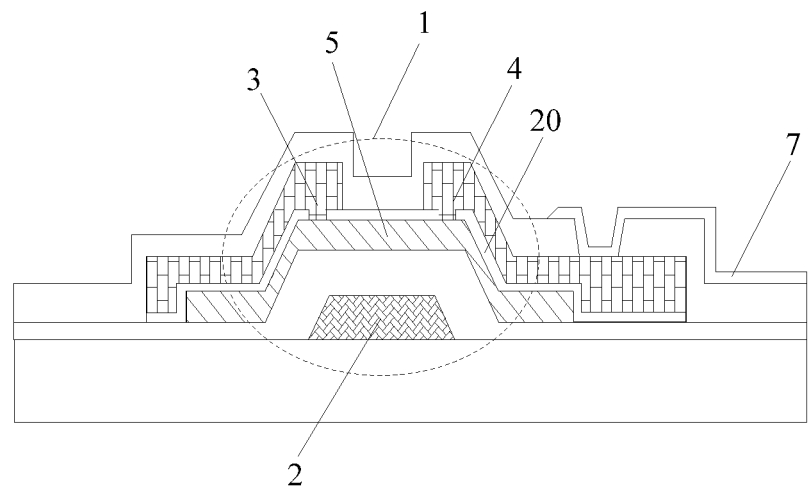
FIG. 1 is a partial structural representation of an oxide TFT array substrate in the prior art.

The technical solutions according to embodiments of the present disclosure will be further described in details below in conjunction with the drawings and embodiments. The embodiments below are used for illustrating the present disclosure, but not intended to limit the scope of the present disclosure.

It should be noted that, the terms "above" and "below" used in embodiments of the present disclosure are only used for illustrating the embodiments of the present disclosure by referring to the drawings, but intended to limit the present disclosure.

Embodiment 1

This embodiment provides a method for manufacturing an oxide TFT array substrate, which includes a step of forming an oxide TFT on a base substrate, in which the oxide TFT includes a gate electrode, a gate insulating layer, an oxide active layer pattern, a source electrode and a drain electrode. In the present embodiment, the step of forming the oxide thin film transistor on the base substrate includes:

forming the gate electrode on the base substrate;

forming the gate insulating layer on the base substrate formed with the gate electrode;

forming the source electrode and the drain electrode on the base substrate formed with the gate insulating layer; and forming the oxide active layer pattern on the base substrate formed with the source electrode and the drain electrode.

In the present embodiment, by forming the source electrode, the drain electrode and the gate electrode below the oxide active layer pattern, in which the gate electrode is located below the source electrode and the drain electrode, so that an etching process for forming the source electrode and the drain electrode does not destroy the oxide active layer pattern. At the same time, as there is no need to form an etch stopping layer on the oxide active layer pattern, a photoetching process for forming a pattern of the etch stopping layer may be left out, thus the productivity of oxide thin film transistor display devices may be improved, and the production cost may be reduced.

According to an embodiment of the present disclosure, the base substrate is made of a transparent material and has a good light transmittance. According to an example, the base substrate may be a glass substrate, a quartz substrate or a transparent resin substrate.

In order to improve a contact resistance between the source electrode/the drain electrode and the oxide active layer pattern, prior to the step of forming the oxide active layer pattern, a plasma treatment may be performed in advance on surfaces of the source electrode and the drain electrode. The plasma treatment, for example, nitrous oxide ($N_2O$) may be used for performing the plasma treatment on the surfaces of the source electrode and the drain electrode, so as to effectively decrease leakage currents of the TFT, and improving phenomena such as a picture flicker, a crosstalk and an image retention in the display device, which further improve a display performance thereby. Additionally, if a hydrogen ion enters the oxide active layer pattern, an oxygen vacancy in the oxide active layer pattern will be changed, so as to influence the performance and the product life of the TFT; therefore an annealing and dehydrogenation treatment is generally performed on the oxide active layer pattern, so as to prevent the hydrogen ion from entering the oxide active layer pattern. However, the annealing and dehydrogenation treatment decreases an oxygen content of the oxide active layer pattern, which influences semiconductor features thereof. While by the plasma treatment, the oxygen content of the source electrode and the drain electrode may be increased, and a sufficient oxygen content of the source electrode and the drain electrode may replenish an oxygen element for the oxide active layer pattern, so that the semiconductor features of the oxide active layer pattern may be guaranteed.

A process for manufacturing an oxide TFT array substrate according to embodiments of the present disclosure will be illustrated in details below by taking a process for manufacturing an oxide TFT array substrate of an Advanced Super Dimension Switch (ADS, or referred to as AD-SDS) mode display device as an example.

In ADS, all of oriented liquid crystal molecules located between slot pixel electrodes and located over the pixel electrode in a liquid crystal cell are able to generate a rotation via a multi-dimensional electric field formed by an electric field generated at an edge of the slot pixel electrodes (i.e., a pixel electrode has a plurality of slots extending to different directions) in a same plane and an electric field generated between a slot pixel electrode layer and a plate common electrode, so that working efficiency of liquid crystals may be improved, and the light transmittance may be increased. By ADS technology, a display device may have an improved picture quality, with advantages of a higher resolution, a higher transmittance, a lower power consumption, a wider visual angle, a higher aperture ratio, a lower color difference, no push Mura, and the like.

A method for manufacturing an oxide TFT array substrate will be illustrated below in conjunction with FIG. 2 to FIG. 6. The method includes:

Step S1: forming a pattern including a gate electrode 2 and a common electrode 6 on a base substrate 10, and forming a gate insulating layer 11 on the gate electrode 2;

Step S2: forming a pattern including a source electrode 3 and a drain electrode 4 on the gate insulating layer 11;

Step S3: forming an oxide active layer pattern 5 on the source electrode 3 and the drain electrode 4;

Step S4: forming a passivation layer 12 on the oxide active layer pattern 5, and forming a passivation layer via hole 9 on the passivation layer 12; and Step S5: forming a slot pixel electrode 7' on the passivation layer via hole 9.

In the above steps, the oxide TFT array substrate of an ADS-mode display device may be manufactured via 5 photoetching processes, so that the cost may be saved, and the productivity may be improved.

Figure 3:
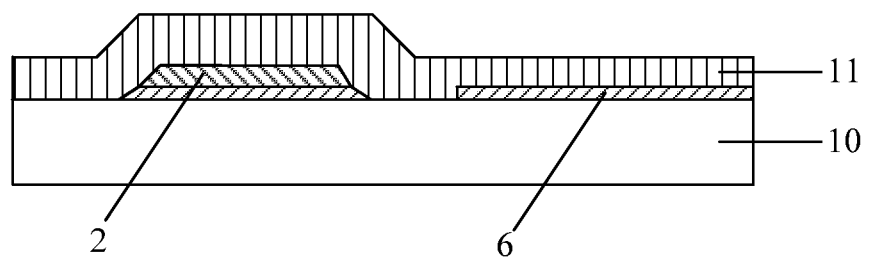
FIG. 3 to FIG. 6 are schematic diagrams showing a process for manufacturing an oxide TFT array substrate according to an embodiment of the present disclosure.

According to an example of the present disclosure, as shown in FIG. 3, the Step S1 is specifically as followings:

first of all, a transparent conductive layer (not shown in drawings) and a gate metal layer (not shown in drawings) are formed in turn on the base substrate 10. Specifically, for example, a transparent conductive layer (such as: tin indium oxide, zinc indium oxide) and a gate metal layer may be formed in turn on the base substrate 10 via a coating process, a chemical deposition process, a sputtering process and the like. Furthermore, in order to improve adhesivity and diffusivity of the gate electrode 2, a third buffer layer pattern (not shown in drawings) may also be formed between the gate metal layer and the transparent conductive layer. Additionally, a fourth buffer layer pattern (not shown in drawings) may also be formed between the gate metal layer and the gate insulating layer 11, in which the third buffer layer and the fourth buffer layer are both arranged in such a manner so as to be in contact with the gate metal layer and corresponding to a region where the gate electrode 2 is located. According to an example of the present disclosure, a material of the third buffer layer and the fourth buffer layer may be MoNb, MoW or MoTi.

Then, a pattern including a gate electrode 2 and a common electrode 6 is formed by using a half-tone or gray-tone mask plate via a one-time patterning process. Specifically, for example, the pattern including the gate electrode 2 and the common electrode 6 may be formed according to the following processes: first of all, after a layer of photoresist is coated on the fourth buffer layer, the photoresist is exposed and developed via the half-tone or gray-tone mask plate to form a photoresist-removed region, a photoresist-totally-remained region and a photoresist-half-remained region, in which the photoresist-totally-remained region corresponds to a region where the gate electrode is located, the photoresist-half-reserved region corresponds to a region where the common electrode is located, and the photoresist-removed region corresponds to other regions; then, the fourth buffer layer, the gate metal layer, the third buffer layer and the transparent conductive layer at the photoresist-removed region are completely etched off via a first etching process, in which in the first etching process, for example, the fourth buffer layer, the gate metal layer, the third buffer layer and the transparent conductive layer are etched via a wet process; next, the photoresist at the photoresist-half-remained region is removed via an ashing process to expose the fourth buffer layer in this region; then, the fourth buffer layer and the gate metal layer at the photoresist-half-remained region are completely etched off via a second etching process to form a pattern including a common electrode 6 from the transparent conductive layer in this region, in which in the second etching process, for example, the fourth buffer layer and the gate metal layer are etched via a wet process; and finally, the remaining photoresist is peeled off, specifically, the photoresist at the photoresist-totally-remained region is peeled off to form the pattern including the gate electrode 2 from the gate metal layer in this region. In this step, the pattern including the gate electrode 2 and the common electrode 6 is formed simultaneously via a one-time patterning process, thus the production cost may be reduced.

Finally, a gate insulating layer 11 is formed on the gate electrode 2. Specifically, for example, a gate insulating layer 11 may be formed on the gate electrode 2 via a coating process, a chemical deposition process, a sputtering process and the like. According to an example of the present disclosure, the gate insulating layer 11 has a thickness of 50 nm to 300 nm, which may be a silicon dioxide layer, or may be a composite layer consisting of two or three layers of a silicon dioxide layer, a silicon oxynitride layer and a silicon nitride layer. Moreover, for example, the silicon dioxide layer is arranged close to the oxide active layer pattern, since hydrogen content in $SiO_2$ is lower, which does not influence semiconductor features of the oxide active layer pattern 5.

In the present embodiment, after the gate electrode 2 and the gate insulating layer 11 are formed on the base substrate 10, the Step S2 is performed, i.e., forming the source electrode 3 and the drain electrode 4 of the oxide TFT on the gate insulating layer 11.

Figure 4:
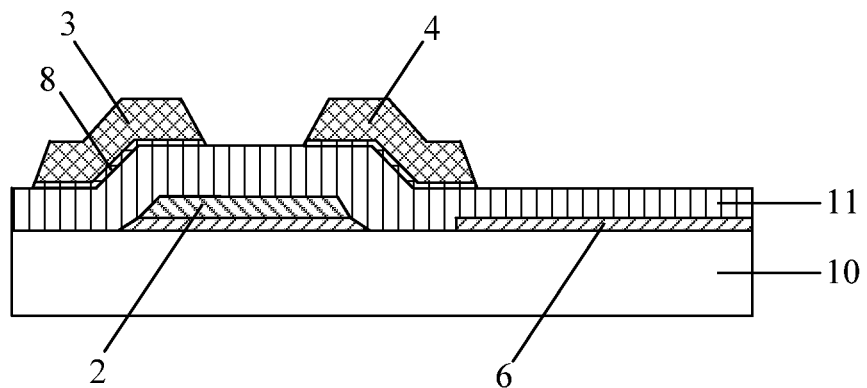

As shown in FIG. 4, the Step S2 is specifically as followings:

first of all, a source/drain metal layer (not shown in drawings) is formed on the gate insulating layer 11 via a coating process, a chemical deposition process, a sputtering process; then, after a layer of photoresist is coated on the source/drain metal layer, the photoresist is exposed and developed via an ordinary mask plate to form a photoresist-remained region and a photoresist-removed region, for example, the coating process may be a spin coating process, and the photoresist-remained region corresponds to a region where the source electrode 3 and the drain electrode 4 are located, and the photoresist-removed region corresponds to other regions; then, the source/drain metal layer at the photoresist-removed region is completely etched off via a wet process; and finally, the remaining photoresist is peeled off to expose the source/drain metal layer corresponding to the photoresist-remained region, and the pattern including the source electrode 3 and the drain electrode 4 is formed from the source/drain metal layer in this region Furthermore, in order to improve the adhesivity and diffusivity of the source electrode 3 and the drain electrode 4, a first buffer layer pattern 8 may be formed between the gate insulating layer 11 and the source electrode 3/the drain electrode 4. Additionally, a second buffer layer pattern (not shown in drawings) may also be formed between the source electrode 3/the drain electrode 4 and the oxide active layer pattern 5, and the first buffer layer pattern 8 and the second buffer layer pattern are both arranged in such a manner so as to be in contact with the source electrode 3 the drain electrode 4. For example, a material of the first buffer layer pattern 8 and the second buffer layer pattern may be MoNb, MoW or MoTi, and the first buffer layer pattern 8 and the second buffer layer pattern may also be formed with the source electrode 3 and the drain electrode 4 in one patterning process, so that the cost may be saved.

In the Step S2, after the source electrode 3 and the drain electrode 4 are formed, a plasma treatment is performed on surfaces of the source electrode 3 and the drain electrode 4 via nitrous oxide ($N_2O$) to improve a contact resistance between the source electrode 3/the drain electrode 4 and the oxide active layer pattern, and lower the leakage current of the oxide TFT.

In the present embodiment, after the source electrode 3 and the drain electrode 4 are formed on the gate insulating layer 11, the Step S3 is performed, i.e., forming an oxide active layer pattern 5 on the source electrode 3 and the drain electrode 4.

Figure 5:
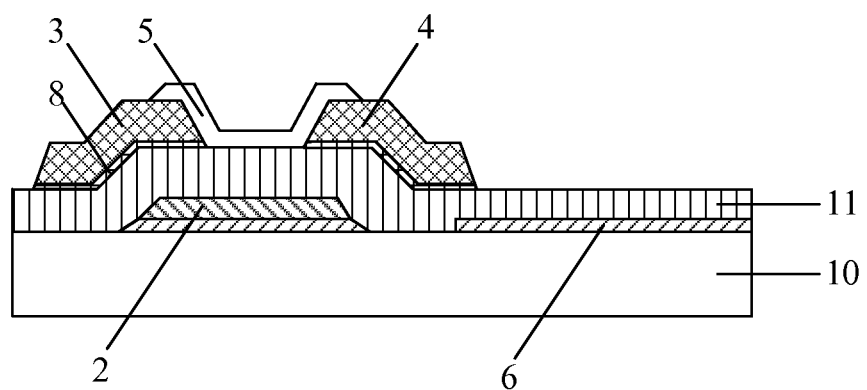

As shown in FIG. 5, the Step S3 is specifically as followings:

first of all, an oxide active layer (not shown in drawings) is formed on the source electrode 3 and the drain electrode 4 via a magnetron sputtering film-forming process; and then, the oxide active layer pattern 5 is formed using an ordinary mask plate via a one-time patterning process (including coating a photoresist, exposing, developing and etching).

In the present embodiment, after the oxide active layer pattern 5 is formed on the source electrode 3 and the drain electrode 4, the Step S4 is performed, i.e., forming a passivation layer 12 on the oxide active layer pattern 5, and forming a passivation layer via hole 9 on the passivation layer 12.

Figure 6:
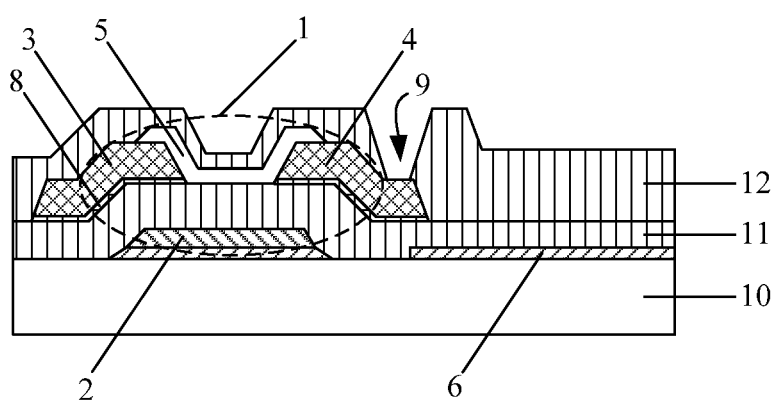

As shown in FIG. 6, the Step S4 is specifically as followings:

First of all, a passivation layer 12 is formed on the oxide active layer pattern 5, thus manufacturing the oxide TFT is accomplished. In order to prevent the oxide active layer pattern 5 from being destroyed during forming the passivation layer 12, for example, the passivation layer 12 may be formed via a low-temperature and high-density deposition process, in which a temperature of the deposition process is required to be controlled below 200° C. A material of the passivation layer 12 may be a composite layer of a double layers consisting of a silicon dioxide layer and a silicon oxynitride layer, or may be a composite layer of a triple layers consisting of silicon dioxide layer, silicon oxynitride layer and silicon nitride layer.

Then, a passivation layer via hole 9 is formed above the drain electrode 4. Moreover, in order to improve stability of a TFT device, after the passivation layer via hole 9 is manufactured, an annealing treatment may also be performed on the passivation layer 12, an annealing temperature may be between 250° C. and 350° C.

In the present embodiment, after the passivation layer 12 is formed on the oxide active layer pattern 5 and the passivation layer via hole 9 is formed on the passivation layer 12, the Step S5 is performed, i.e., forming a slot pixel electrode 7' on the passivation layer via hole 9.

Figure 2:
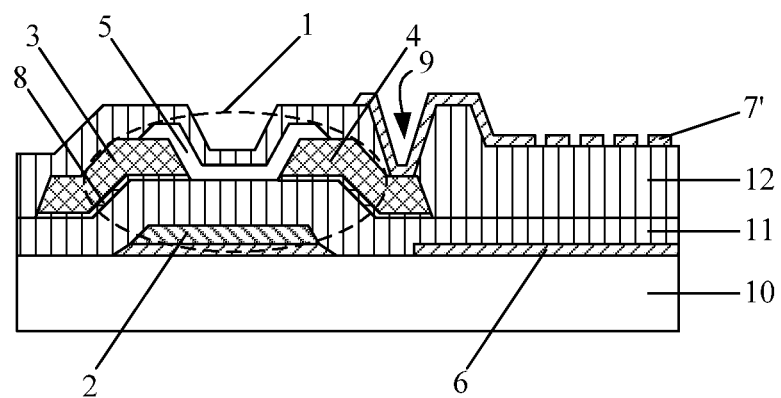
FIG. 2 is a partial structural representation of an oxide TFT array substrate according to an embodiment of the present disclosure.

As shown in FIG. 2, the Step S5 is specifically as followings:

a slot pixel electrode 7' of the array substrate is formed on the passivation layer via hole 9, so that the slot pixel electrode 7' connects the drain electrode 4 of the oxide TFT 1 by the passivation layer via hole 9. According to an example of the present disclosure, a material of the slot pixel electrode 7' may be, for example, a transparent conductive material (for example: tin indium oxide and zinc indium oxide).

Additionally, in the present embodiment, in order to improve the stability of the oxide TFT array substrate and lower the resistivity of the slot pixel electrode 7', an annealing treatment may be performed after the oxide TFT array substrate is manufactured, in which an annealing temperature may be between 250° C. and 300° C.

The present embodiment is only used for specifically illustrating technical solutions of the present disclosure by taking the process for manufacturing the oxide TFT array substrate of the ADS-mode display device as an example, but not intended to limit the present disclosure. For all display devices using an oxide TFT array substrate, for example, a TN-mode display device, an IPS-mode display device, and the like, the oxide TFT array substrates thereof may be manufactured according to the technical solutions of the present disclosure.

Embodiment 2

This present embodiment provides an oxide TFT. As shown in FIG. 2, in this embodiment, the oxide TFT 1 includes a gate electrode 2, a gate insulating layer 11, an oxide active layer pattern 5, a source electrode 3 and a drain electrode 4. According to an example, the source electrode 3 and the drain electrode 4 are located below the oxide active layer pattern 5, the gate electrode 2 is located below the source electrode 3 and the drain electrode 4, and the gate insulating layer 1 is located between the gate electrode 2 and the source electrode 3/the drain electrode 4.

For the oxide TFT 1 of the present embodiment, by forming the source electrode 3, the drain electrode 4 and the gate electrode 2 below the oxide active layer pattern 5, in which the gate electrode 2 is located below the source electrode 3 and the drain electrode 4, then an etching process for forming the source electrode 3 and the drain electrode 4 does not destroy the oxide active layer pattern 5. Moreover, as there is no need to form an etch stopping layer on the oxide active layer pattern 5, a photoetching process for forming a pattern of the etch stopping layer may be left out, thus the productivity of the oxide thin film transistor array substrate may be improved, and the production cost may be reduced.

In the present embodiment, a first buffer layer pattern 8 is formed between the gate insulating layer 11 and the source electrode 3/the drain electrode 4, in which the first buffer layer pattern 8 corresponds to a region where the source electrode 3 and the drain electrode 4 are located, and the first buffer layer pattern 8 is arranged in such a manner so as to be in contact with the source electrode 3 and the drain electrode 4, so as to improve the adhesivity and diffusivity of the source electrode 3 and the drain electrode 4. Additionally, a second buffer layer pattern (not shown in drawings) may also be formed between the source electrode 3/the drain electrode 4 and the oxide active layer pattern 5 and be arranged in such a manner so as to be in contact with the source electrode 3 and the drain electrode 4. According to an example of the present disclosure, a material of the first buffer layer pattern 8 and the second buffer layer pattern may be, for example, MoNb, MoW or MoTi.

Embodiment 3

The present embodiment provides an oxide TFT display device, which may be a device including an oxide thin film transistor, for example, an oxide TFT array substrate and an oxide TFT display device, and the like. As shown in FIG. 2, the oxide TFT display device includes an oxide thin film transistor 1 formed on a base substrate 10, in which the oxide thin film transistor 1 includes a gate electrode 2, a gate insulating layer 11, an oxide active layer pattern 5, a source electrode 3 and a drain electrode 4. In which, the source electrode 3 and the drain electrode 4 are located below the oxide active layer pattern 5, the gate electrode 2 is located below the source electrode 3 and the drain electrode 4, and the gate insulating layer 1 is located between the gate electrode 2 and the source electrode 3/the drain electrode 4.

For the oxide TFT display device of the present embodiment, by forming the source electrode 3, the drain electrode 4 and the gate electrode 2 below the oxide active layer pattern 5, in which the gate electrode 2 is located below the source electrode 3 and the drain electrode 4, then an etching process for forming the source electrode 3 and the drain electrode 4 does not destroy the oxide active layer pattern 5. Moreover, as there is no need to form an etch stopping layer on the oxide active layer pattern 5, a photoetching process for forming a pattern of the etch stopping layer may be left out, thus the productivity of the oxide thin film transistor array substrate may be improved, and the production cost may be reduced.

In the present embodiment, a first buffer layer pattern 8 is formed between the gate insulating layer 11 and the source electrode 3/the drain electrode 4, in which the first buffer layer pattern 8 corresponds to a region where the source electrode 3 and the drain electrode 4 are located, and the first buffer layer pattern 8 is arranged in such a manner so as to be in contact with the source electrode 3 and the drain electrode 4, so as to improve the adhesivity and diffusivity of the source electrode 3 and the drain electrode 4. Additionally, a second buffer layer pattern (not shown in drawings) may also be formed between the source electrode 3/the drain electrode 4 and the oxide active layer pattern 5 and be arranged in such a manner so as to be in contact with the source electrode 3 and the drain electrode 4. According to an example of the present disclosure, a material of the first buffer layer pattern 8 and the second buffer layer pattern may be, for example, MoNb, MoW or MoTi, and the source electrode 3 and the drain electrode 4 may have a thickness of for example, 200 nm to 300 nm.

Furthermore, in order to improve the adhesivity and diffusivity of the gate electrode 2, a third buffer layer pattern (not shown in drawings) is formed between the base substrate 10 and the gate electrode 2, in which the third buffer layer pattern corresponds to a region where the gate electrode 2 is located, and is arranged in such a manner so as to be in contact with the gate electrode 2. Additionally, a fourth buffer layer pattern (not shown in drawings) may also be formed between the gate electrode 2 and the gate insulating layer 11 and be arranged in such a manner so as to be in contact with the gate electrode 2. According to example of the present disclosure, a material of the third buffer layer pattern and the fourth buffer layer pattern may be, for example, MoNb, MoW or MoTi, and the gate electrode 2 may have a thickness of, for example, 200 nm to 300 nm.

Additionally, the gate insulating layer 11 may have a thickness of, for example, 150 nm 300 nm, and the gate insulating layer 11 may be a silicon dioxide layer, or may be a composite layer consisting of two or three layers of a silicon dioxide layer, a silicon oxynitride layer and a silicon nitride layer. Moreover, for example, the silicon dioxide layer may be arranged close to the oxide active layer pattern 5, since a hydrogen content in $SiO_2$ is lower, which does not influence the semiconductor features of the oxide active layer pattern 5. The oxide active layer pattern 5 may have a thickness of, for example, 40 nm to 50 nm, and a material thereof may be an oxide semiconductor, for example, tin indium oxide or zinc indium oxide, and the like.

Further illustration is given below by taking an oxide TFT array substrate of an ADS-mode display device as an example. As shown in FIG. 2, the oxide TFT array substrate further includes a common electrode 6, a slot pixel electrode 7' and a passivation layer 12, in which the slot pixel electrode 7' is connected with the drain electrode 4 of the oxide TFT via a passivation layer via hole 9. In the present embodiment, the common electrode 6 has a thickness of about 70 nm, and is arranged corresponding to a position where the slit pixel electrode 7' is located, so that under the control of the oxide TFT 1, a multi-dimensional electric field is formed by an electric field generated between edges of the slot pixel electrode 7', and an electric field generated between the slot pixel electrode 7' and a plate common electrode 6, for driving liquid crystal molecules to rotate. In the present embodiment, for example, the gate electrode 2 and the common electrode 6 of the oxide TFT 1 are formed simultaneously via a one-time patterning process, so that the production cost may be reduced, and the productivity may be improved.

The above descriptions show some preferred embodiments of the disclosure. It should be pointed out that, for one of ordinary skills in the art, various improvements and modifications may be made without departing from the principles of the disclosure, and these improvements and modifications should be construed as pertaining the protection scope of the disclosure.

What is claimed is:

1. A method for manufacturing an oxide thin film transistor array substrate, comprising a step of forming an oxide thin film transistor on a base substrate, wherein the oxide thin film transistor comprises a gate electrode, a gate insulating layer, an oxide active layer pattern, a source electrode and a drain electrode, wherein the step of forming the oxide thin film transistor on the base substrate comprises:

forming the gate electrode on the base substrate;

forming the gate insulating layer on the base substrate formed with the gate electrode;

forming the source electrode and the drain electrode on the base substrate formed with the gate insulating layer; and forming the oxide active layer pattern on the base substrate formed with the source electrode and the drain electrode, wherein the step of forming the source electrode and the drain electrode on the base substrate formed with the gate insulating layer comprises:

forming a first buffer layer, a source/drain metal layer and a second buffer layer in turn on the base substrate formed with the gate insulating layer;

coating a photoresist on the second buffer layer;

exposing and developing the photoresist, to form a photoresist-remained region and a photoresist-removed region, wherein the photoresist-remained region corresponds to a region where the source electrode and the drain electrode are located, and the photoresist-removed region corresponds to other regions;

etching off the second buffer layer, the source/drain metal layer and the first buffer layer at the photoresist-removed region completely via an etching process; and peeling off the remaining photoresist to form a pattern comprising the source electrode and the drain electrode.

2. The method according to claim 1, further comprising:

forming a passivation layer on the oxide active layer pattern at a temperature lower than 200° C.

3. The method according to claim 1, wherein prior to the step of forming the oxide active layer pattern on the base substrate formed with the source electrode and the drain electrode, the method further comprises a step of:

performing a plasma treatment on surfaces of the source electrode and the drain electrode.

4. The method according to claim 3, wherein nitrous oxide is used for performing the plasma treatment on the surfaces of the source electrode and the drain electrode.

5. The method according to claim 1, wherein a material of the first buffer layer and the second buffer layer is MoNb, MoW or MoTi.

* * * * *